(12) United States Patent
Toya et al.

(10) Patent No.: US 11,050,401 B2
(45) Date of Patent: Jun. 29, 2021

(54) CURRENT SENSOR AND MEASUREMENT DEVICE

(71) Applicant: HIOKI E.E. CORPORATION, Ueda (JP)

(72) Inventors: Shogo Toya, Ueda (JP); Hidekazu Masuda, Eschborn (DE); Osamu Yokota, Ueda (JP)

(73) Assignee: HIOKI E.E. Corporation, Ueda (JP)

( * ) Notice: Subject to any disclaimer, the term of this patent is extended or adjusted under 35 U.S.C. 154(b) by 0 days.

(21) Appl. No.: 16/815,971

(22) Filed: Mar. 11, 2020

(65) Prior Publication Data
US 2020/0295728 A1    Sep. 17, 2020

(30) Foreign Application Priority Data
Mar. 12, 2019 (JP) .............................. JP2019-045106

(51) Int. Cl.
| H03H 7/38  | (2006.01) |
| H03H 7/01  | (2006.01) |
| G01R 15/12 | (2006.01) |
| G01R 15/18 | (2006.01) |
| H03H 7/06  | (2006.01) |
| G01R 19/00 | (2006.01) |

(52) U.S. Cl.
CPC ............. *H03H 7/38* (2013.01); *G01R 15/183* (2013.01); *G01R 19/0092* (2013.01); *H03H 7/0153* (2013.01); *H03H 7/06* (2013.01)

(58) Field of Classification Search
None
See application file for complete search history.

(56) References Cited

U.S. PATENT DOCUMENTS 10,416,197 B2 *  9/2019  Gotz .................... G01R 21/133
2017/0343585 A1  11/2017  Harano

FOREIGN PATENT DOCUMENTS

JP     2015034758 A    2/2015
JP     2016114585 A    6/2016

* cited by examiner

*Primary Examiner* — An T Luu
(74) *Attorney, Agent, or Firm* — Jordan IP Law, LLC

(57) ABSTRACT

Technology includes a current sensor that detects electric current flowing through an object. The current sensor includes a magnetic core through which the object is inserted, a coil wound around the magnetic core, a transmission line that transmits electric current supplied from the coil, a terminating resistor that converts electric current from a terminating end of the transmission line into voltage and outputs the voltage, and an impedance matching unit that implements impedance matching between the coil and the terminating resistor. The impedance matching unit raises, to a characteristic impedance of the transmission line, at least one of an impedance viewed from the terminating end of the transmission line toward the terminating resistor and an impedance viewed from a starting end of the transmission line toward the coil, in a band of frequency components involving amplitude attenuation among frequency components of the voltage output from the terminating resistor.

12 Claims, 9 Drawing Sheets

CURRENT SENSOR AND MEASUREMENT DEVICE

CROSS-REFERENCE TO RELATED APPLICATION

The present application claims priority 35 U.S.C. § 119 to Japanese Patent Publication No. JP 2019-045106 (filed on Mar. 12, 2019), which is hereby incorporated by reference in its entirety.

TECHNICAL FIELD

The present invention relates to a current sensor and a measurement device configured to detect electric current flowing through an object to be measured.

BACKGROUND ART

JP2016-114585A discloses a current sensor including: a coil wound around a magnetic core through which an object to be measured is inserted; a filter that limits a frequency region of electric current input from the coil, and outputs the resultant electric current to a starting end of a transmission line; and a terminating resistor that converts the electric current from the terminating end of the transmission line to voltage.

SUMMARY OF INVENTION

In the current sensor described above, it is a common practice to provide a starting resistor or a terminating resistor, having a resistance value equivalent to a characteristic impedance of the transmission line, at the starting end or the terminating end of the transmission line, to suppress the waveform distortion of a signal due to an impact of reflection attributable to impedance mismatch during high frequency transmission.

Unfortunately, there is a problem that a large amount of power is consumed at the starting resistor or the terminating resistor when the resistance value of the starting resistor or the terminating resistor connected to the end of the transmission line becomes large as a result of setting the resistance value of the starting resistor or the terminating resistor to be equivalent to the characteristic impedance of the transmission line. In particular, a larger electric current flowing through the object to be measured leads to a more notable increase in the power consumed in the current sensor.

The present invention is achieved focusing on such a problem, and an object thereof is to suppress the increase in the power consumed in a current sensor, and also to suppress the waveform distortion of a signal output from the current sensor.

According to an aspect of the present invention, a current sensor configured to detect electric current flowing through an object to be measured includes a magnetic core through which the object to be measured is inserted, a coil wound around the magnetic core, a transmission line configured to transmit electric current supplied from the coil, a terminating resistor configured to convert electric current from a terminating end of the transmission line into voltage and outputs the voltage; and a matching unit configured to implement impedance matching between the terminating resistor and the coil. The matching unit is configured to raise, to a characteristic impedance of the transmission line, at least one of an impedance viewed from the terminating end of the transmission line toward the terminating resistor and an impedance viewed from a starting end of the transmission line toward the coil, in a band of frequency components involving amplitude attenuation among frequency components of the voltage output from the terminating resistor.

According to this aspect, in the attenuation band which is a band including frequency components involving amplitude attenuation, the matching unit raises at least one of the impedance viewed from the terminating end of the transmission line toward the terminating resistor and the impedance viewed from the starting end of the transmission line toward the coil, to the characteristic impedance of the transmission line. As a result, the reflection is less likely to occur around the attenuation band with a large impact of the reflection, whereby the waveform distortion of a signal output from the current sensor can be suppressed.

On the other hand, with the matching unit, the at least one of the impedance viewed from the terminating end of the transmission line toward the terminating resistor and the impedance viewed from the starting end of the transmission line toward the coil stays substantially the same outside the attenuation band. This means that the power consumed by the current sensor almost does not increase at all, whereby an increase in the power consumed by the current sensor can be suppressed.

Thus, with the aspect described above, an increase in the power consumed by the current sensor can be suppressed, and also the waveform distortion of the signal output from the current sensor can be suppressed.

DESCRIPTION OF EMBODIMENTS

Embodiments of the present invention will be described below with reference to the attached drawings.

First Embodiment

Figure 1:
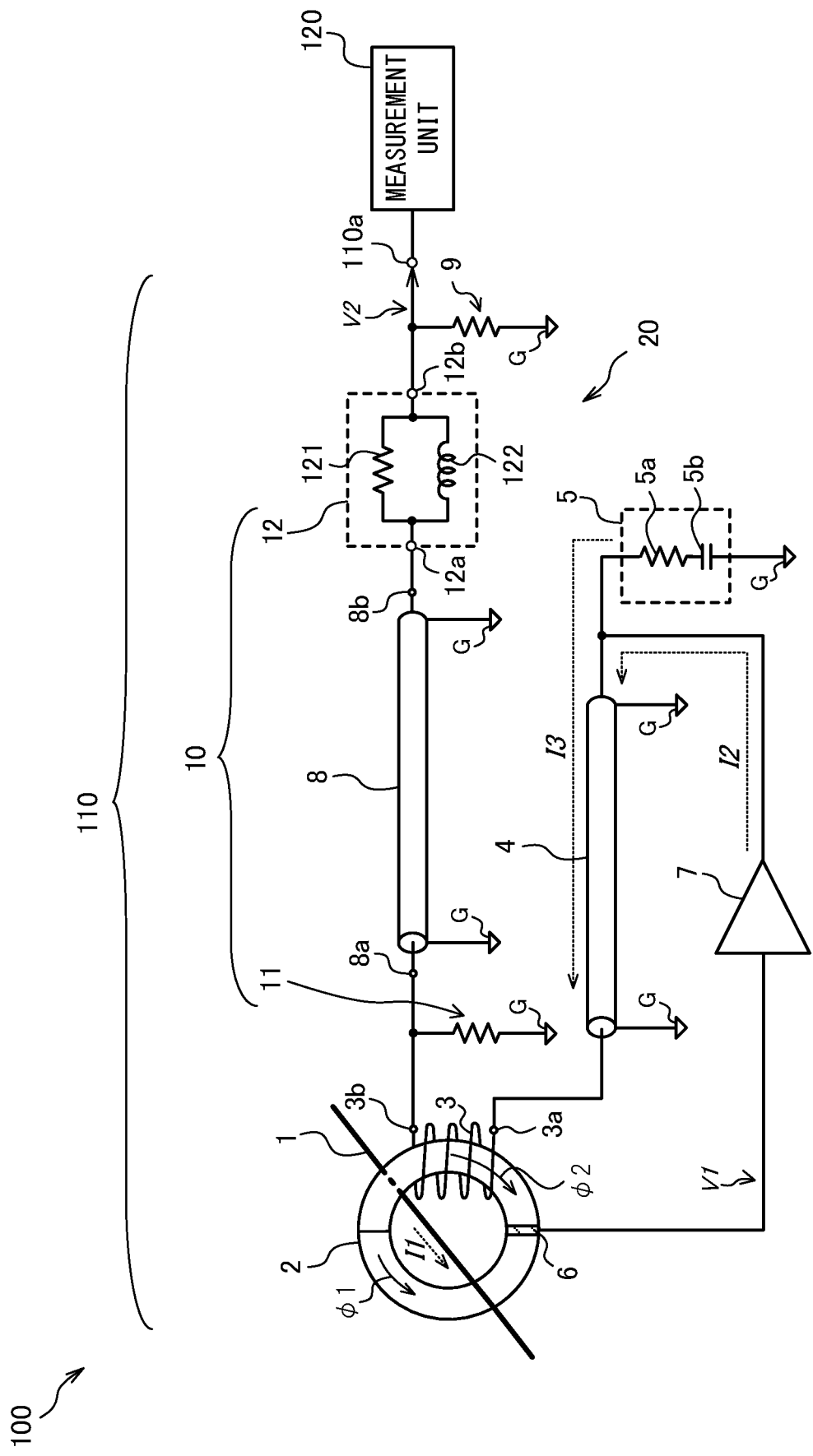
FIG. 1 is a diagram showing a configuration of a measurement device including a current sensor according to a first embodiment.

FIG. 1 is a diagram showing a configuration of a measurement device 100 according to a first embodiment.

The measurement device 100 measures a physical quantity related to an object to be measured on the basis of a detection signal as a result of detecting electric current flowing through the object to be measured. The measurement device 100 according to the present embodiment includes a current sensor 110 and a measurement unit 120.

The current sensor 110 detects electric current flowing through a measurement cable way 1 serving as the object to be measured. The current sensor 110 according to the present embodiment is configured as a zero-flux (magnetic balance) current sensor, and detects electric current to be measured I1 that is alternating current (AC) flowing through the measurement cable way 1.

The current sensor 110 includes a magnetic core 2, a coil 3, a transmission line 4, a capacitive load 5, a magnetoelectric conversion output unit 6, a voltage current converter 7, a transmission circuit 20, and an output terminal 110a. The transmission circuit 20 includes a transmission line 8, a terminating resistor 9, and an impedance matching unit 10.

The magnetic core 2 has an annular overall shape. In the present embodiment, the annular magnetic core 2 is of a splitting type to be capable of being opened and closed. Thus, the measurement cable way 1 under a live wire condition can be inserted through, that is, clamped by the magnetic core 2. The magnetic core 2 is not limited to the splitting type and may be of an inserted type (which cannot be split).

The coil 3 is formed by winding a wire material around the magnetic core 2. The coil 3 has a first end 3a directly or indirectly connected to a ground G, and a second end 3b connected to a starting end 8a of the transmission line 8. The ground G is a ground line for supplying reference potential.

In the present embodiment, the first end 3a of the coil 3 is connected to the ground G via the transmission line 4 and the capacitive load 5. The first end 3a of the coil 3 may be directly connected to the ground G. In such a case, the current sensor 110 is configured as a current transformer (CT) current sensor.

The transmission line 4 is a transmission line path with a predetermined characteristic impedance value set (defined). In the present embodiment, the characteristic impedance of the transmission line 4 is set to be 50Ω. The transmission line 4 has a first end connected to the first end 3a of the coil 3 and a second end connected to the capacitive load 5.

For example, the transmission line 4 is formed by a coaxial cable with an unshown shield connected to the ground G. In this case, the characteristic impedance of the transmission line 4 is set to be 50Ω or 75Ω. The transmission line 4 is not limited to a coaxial cable, and may be formed by various transmission lines such as a twist pair cable, as long as the characteristic impedance is defined to be a predetermined fixed value.

The capacitive load 5 is formed by a serial circuit with a resistance element 5a and a capacitor 5b connected to each other in series. The resistance element 5a has a resistance value that is no larger than several tens of Ω. The capacitor 5b has a capacitance value resulting in the impedance that is no larger than several tens of Ω in a frequency band of the electric current to be measured I1.

For example, the resistance value of the resistance element 5a is set to be 50Ω, and the capacitance of the capacitor 5b is set to be 0.1 μF. The capacitive load 5 may have a configuration with the resistance element 5a arranged on the ground G side, instead of a configuration with the capacitor 5b arranged on the ground G side.

The magnetoelectric conversion output unit 6 detects a magnetic flux produced in the magnetic core 2, and outputs output voltage V1 with a voltage value corresponding to the magnetic flux density of the magnetic flux detected. In the present embodiment, the magnetoelectric conversion output unit 6 is provided in a gap formed in the magnetic core 2, and is formed by a Hall element.

The output voltage V1 of the Hall element has a voltage value proportional or substantially proportional to the magnitude of the magnetic flux density of the magnetic flux produced in the magnetic core 2. An element other than the Hall element such as a flux gate magnetic detection element or the like may be used for the magnetoelectric conversion output unit 6.

The voltage current converter 7 generates negative feedback electric current I2 as detection electric current, on the basis of the output voltage V1 of the magnetoelectric conversion output unit 6. The voltage current converter 7 supplies the negative feedback electric current I2 generated to the first end 3a of the coil 3 via the transmission line 4. For example, the voltage current converter 7 is formed by an operational amplifier.

The voltage current converter 7 controls the electric current value of the negative feedback electric current I2 so that zero volt (0 V) is obtained as the output voltage V1, that is, so that the magnetic flux density of the magnetic flux produced in the magnetic core 2 becomes 0. The magnetic flux produced in the magnetic core 2 is a magnetic flux as a difference ($\varphi 1 - \varphi 2$) between a magnetic flux $\varphi 1$ produced when the electric current to be measured I1 flows through the measurement cable way 1 inserted through the magnetic core 2 and a magnetic flux $\varphi 2$ produced when the negative feedback electric current I2 flows through the coil 3. Thus, the voltage current converter 7 increments or decrements the electric current value of the negative feedback electric current I2 to offset the magnetic flux $\varphi 1$ with the magnetic flux $\varphi 2$.

Thus, a potential of the first end 3a of the coil 3 in a case where a frequency of the negative feedback electric current I2 supplied to the first end 3a of the coil 3 or a frequency of electric current I3 described later is equal to or higher than a crossover frequency is substantially set to be the reference potential of the ground G. The crossover frequency is a frequency at which the frequency characteristics of the negative feedback electric current I2 and of the electric current I3 intersect. The electric current value of the electric current I2 or I3 that is the detection electric current supplied from the coil 3 to the transmission line 8 is a value (I1/N) obtained by dividing the electric current value of the electric current to be measured I1 by the number of turns N of the coil 3.

The transmission line 8 transmits the detection electric current supplied from the coil 3. The transmission line 8 is a transmission line path with the characteristic impedance set to be a predetermined value, as in the case of the transmission line 4 described above. The transmission line 8 is formed by various transmission lines such as a coaxial cable with the characteristic impedance set to be 50Ω or 75Ω, or a twist pair cable with the characteristic impedance defined to be a fixed value.

In the present embodiment, the length of the transmission line 8 is 1 m or more, and a characteristic impedance of the transmission line 8 is set to be 50Ω. The transmission line 8 has a starting end 8a as a first end connected to the first end 3a of the coil 3 and has a terminating end 8b as a second end connected to an input terminal 12a of a matching circuit 12.

The terminating resistor 9 converts the electric current from the terminating end 8b of the transmission line 8 into voltage, and outputs the voltage obtained by the conversion to the output terminal 110a as detection voltage V2. For example, the terminating resistor 9 includes a resistance element connected between the output terminal 110a and the ground G or an input resistor of a measurement instrument such as an oscilloscope. Alternatively, the terminating resistor 9 may include a plurality of chip resistors.

The terminating resistor 9 has a resistance value set to be a predetermined value smaller than the characteristic impedance of the transmission line 8. Thus, the power consumed by the terminating resistor 9 can be reduced, whereby generation of heat by the terminating resistor 9 can be suppressed.

In the present embodiment, the terminating resistor 9 includes a resistance element, a first end of the terminating resistor 9 is connected to the output terminal 110a, and a second end of the terminating resistor 9 is connected to the ground G. The resistance value of the terminating resistor 9 is set to be 5Ω.

The impedance matching unit 10 includes one or a plurality of electronic parts for implementing impedance matching between the coil 3 and the terminating resistor 9. The impedance matching unit 10 makes the terminating resistor side impedance and the coil side impedance match in a frequency component band including frequency components, involving amplitude attenuation in the frequency components of the detection voltage V2 output from the terminating resistor 9. Specifically, the impedance matching unit 10 increases at least one of the terminating resistor side impedance and the coil side impedance until it reaches the characteristic impedance of the transmission line 8, in the frequency component band involving amplitude attenuation.

The terminating resistor side impedance described above is an impedance viewed from the terminating end 8b of the transmission line 8 toward the terminating resistor 9, and the coil side impedance is an impedance viewed from the starting end 8a of the transmission line 8 toward the coil 3.

The frequency component band involving amplitude attenuation described above will be hereinafter referred to as "attenuation band". The attenuation band of the current sensor 110 is substantially the same as a frequency band involving attenuation of frequency components of the detection electric current output from the coil 3 due to the number of turns of the coil 3 or a parasitic floating capacity of the coil 3.

The attenuation band is a frequency band at and higher than a lower limit frequency that is a frequency value as a result of attenuation by a predetermined value (3 dB for example) from the amplitude of a frequency component involving almost no amplitude attenuation. In the present embodiment, the lower limit frequency of the attenuation band is set to be 100 MHz.

The impedance matching unit 10 according to the present embodiment includes a starting resistor 11 and a matching circuit 12.

The starting resistor 11 is a signal source resistor for impedance matching. The starting resistor 11 is provided to adjust the coil side impedance to be equal to the characteristic impedance of the transmission line 8 at the starting end 8a of the transmission line 8.

The resistance value of the starting resistor 11 is set to be a value resulting in the coil side impedance being the same value or substantially the same value as the characteristic impedance of the transmission line 8. The term substantially the same value used herein refers to a value with which reflection is less likely to occur at both ends of the transmission line 8. Thus, the resistance value of the starting resistor 11 may be set to be 40Ω for example, when the characteristic impedance of the transmission line 8 is 50Ω. As a result, the impedance matching according to the present embodiment tolerates a variation by 20% from the value of the characteristic impedance of the transmission line 8.

In the present embodiment, the starting resistor 11 is connected to the starting end 8a of the transmission line 8 to be in parallel connection with the coil 3. The resistance value of the starting resistor 11 is set to be 50Ω. The starting resistor 11 has a function of dividing a part of the electric current supplied to the transmission line 8 from the coil 3. Thus, the power consumed at the terminating resistor 9 can be reduced.

The matching circuit 12 makes the terminating resistor side impedance approach the characteristic impedance of the transmission line 8 in the attenuation band of the current sensor 110. In the present embodiment, the matching circuit 12 operates as a lowpass filter circuit (lowpass filter) to remove noise of high frequency components.

For example, the matching circuit 12 outputs basic frequency components lower than the cutoff frequency, among the frequency components of the detection electric current supplied from the coil 3, almost without attenuating it at all. On the other hand, the matching circuit 12 attenuates the amplitude of frequency components at or higher than the cutoff frequency, among the frequency components of the detection electric current, such that the amplitude becomes $1/\sqrt{2}$ or less, and outputs the resultant component. Thus, the matching circuit 12 limits the frequency range of the detection electric current to a desired frequency band (a frequency band lower than the cutoff frequency).

The frequency band lower than the cutoff frequency is hereinafter referred to as a "pass band". Generally, the cutoff frequency is set to be at a frequency slightly higher than the upper limit frequency of the electric current to be measured I1 to be detected. For example, the cutoff frequency is set to be at a frequency slightly higher than the lower limit value of the frequency band including frequency components involving amplitude attenuation, among the frequency components of the detection electric current supplied from the coil 3.

For example, the matching circuit 12 includes a plurality of passive elements so that the terminating resistor side impedance can approach the characteristic impedance of the transmission line 8 in a high frequency band that is equal to or higher than the cutoff frequency of the matching circuit 12. Thus, the amount of noise mixed in the current signal output from the matching circuit 12 can be made smaller than in a case where the matching circuit 12 includes active elements.

The matching circuit 12 at least includes a resistance component and an inductance component. The resistance component of the matching circuit 12 is set to be a larger value with a smaller resistance value (predetermined value) of the terminating resistor 9. In other words, the resistance value of the terminating resistor 9 is set to be a predetermined value smaller than the characteristic impedance of the transmission line 8, on the basis of the resistance component of the matching circuit 12.

In the present embodiment, the matching circuit 12 includes a resistance element 121 serving as a resistance component and an inductance element (inductor element) 122 serving as an inductance component. The resistance element 121 and the inductance element 122 are connected in parallel to each other.

The resistance value of the resistance element 121 is set on the basis of a value as a result of subtracting the resistance value of the terminating resistor 9 from the characteristic impedance of the transmission line 8. In the present embodiment, the resistance value of the resistance element 121 is set to be 45Ω, which is the value obtained by subtracting the resistance value 5Ω of the terminating resistor 9 from the characteristic impedance 50Ω of the transmission line 8.

On the other hand, the inductance value of the inductance element 122 is set on the basis of the resistance value of the resistance element 121, the characteristic impedance of the transmission line 8, the resistance value of the terminating resistor 9, and the lower limit frequency of the attenuation band of the current sensor 110 described above. A method of setting the inductance value of the inductance element 122 will be described later with reference to FIG. 3.

In the example described in the present embodiment, the matching circuit 12 includes the resistance element 121 and the inductance element 122. However, this configuration should not be construed in a limiting sense. For example, the matching circuit 12 may include one or a plurality of electronic parts. In such a case, the constants of electronic parts may be set in advance to be fixed numbers, enabling the terminating resistor side impedance to approach the characteristic impedance of the transmission line 8 in the attenuation band of the current sensor 110.

In the present embodiment, the matching circuit 12 has the input terminal 12a connected to the terminating end 8b of the transmission line 8, and has the output terminal 12b connected to the first end of the terminating resistor 9. Thus, the matching circuit 12 is connected in series between the terminating end 8b of the transmission line 8 and the first end of the terminating resistor 9.

With the matching circuit 12 arranged on the terminating resistor 9 side, the coil 3 and the matching circuit 12 can be separated from each other by a distance larger than that in a case where the matching circuit 12 is connected to the starting end 8a of the transmission line 8. As a result, an undesired peak in the frequency characteristics of the matching circuit 12 appearing near the cutoff frequency due to the oscillation between the parasitic capacitance of the coil 3 and the inductance element 122 of the matching circuit 12 can be suppressed.

With the current sensor 110 provided with the matching circuit 12 for impedance matching in the attenuation band of the current sensor 110 as described above, the distortion of the detection signal output from the output terminal 110a of the current sensor 110 to the measurement unit 120 can be suppressed.

The measurement unit 120 measures a physical quantity related to the measurement cable way 1 on the basis of the detection signal output from the current sensor 110. The physical quantity related to the measurement cable way 1 may be a value of the AC flowing through the measurement cable way 1, a value of the AC power, a value of the AC magnetic field produced around the measurement cable way 1, or the like. For example, the measurement unit 120 is formed by an oscilloscope, a power meter, a current meter, or the like.

In the present embodiment, upon receiving the detection voltage V2 from the output terminal 110a as the detection signal obtained by the current sensor 110, the measurement unit 120 measures the electric current to be measured I1 flowing through the measurement cable way 1 inserted through the magnetic core 2 on the basis of the detection voltage V2 received. For example, the measurement unit 120 includes an A/D converter and a CPU that are not shown. The A/D converter converts the detection voltage V2 obtained by the conversion by the current sensor 110, into a digital value. The CPU measures (calculates) the electric current value of the electric current to be measured I1 on the basis of this digital value.

The measurement unit 120 can transmit the electric current value of the electric current to be measured I1 to an external device or store the value in an external storage device via an external interface circuit (not shown). The measurement unit 120 can measure the AC power or the magnetic field intensity, and the like of the measurement cable way 1 on the basis of the detection voltage V2 received, as other measured physical quantities.

The measurement unit 120 includes a display screen such as an LCD, and displays a waveform corresponding to the measured physical quantities on the display screen. For example, the measurement unit 120 displays a time waveform of the measured AC on a display screen having a horizontal axis serving as a time axis. In this case, the detection signal output from the current sensor 110 is used, so that the waveform of the AC with a small distortion attributable to the current sensor 110 can be displayed on the display screen, as the electric current to be measured I1 through the measurement cable way 1.

Next, an operation of the current sensor 110 will be briefly described.

First of all, the magnetoelectric conversion output unit 6 and the voltage current converter 7 mainly operate in a low frequency region where the electric current to be measured I1 flowing through the measurement cable way 1 includes direct current (DC). Specifically, the magnetoelectric conversion output unit 6 detects the magnetic flux ($\varphi1-\varphi2$) produced in the magnetic core 2, and supplies the output voltage V1 corresponding to the density of the detected magnetic flux to the voltage current converter 7. The voltage current converter 7 generates the negative feedback electric current I2 on the basis of the output voltage V1 and supplies the negative feedback electric current I2 to the first end 3a of the coil 3.

In this process, the voltage current converter 7 controls the electric current value of the negative feedback electric current I2 so that 0 volt is obtained as the output voltage V1, that is, so that the magnetic flux $\varphi1$ is offset by the magnetic flux $\varphi2$. As a result, the electric current value of the negative feedback electric current I2 becomes substantially equal to the value (I1/N) obtained by dividing the electric current value of the electric current to be measured I1 by the number of turns N.

Then, a part of the negative feedback electric current I2 output from the second end 3b of the coil 3 flows through the starting resistor 11, and the remaining electric current flows through the terminating resistor 9 via the coil 3, the transmission line 8, and the matching circuit 12 as the detection electric current. The detection electric current is converted into the detection voltage V2 at the terminating resistor 9. In this case, the capacitive load 5 is maintained at a high impedance, whereby the electric current I3 is prevented from leaking to the ground G via the capacitive load 5.

In the matching circuit 12 according to the present embodiment, the impedance of the inductance element 122 is extremely low, whereby an increase in the resistance components can be suppressed. As a result, the terminating resistor side impedance is obtained as a combination of resistance values of the starting resistor 11 and the terminating resistor 9 connected in parallel with each other. In the present embodiment, the resistance value of the starting resistor 11 is 50Ω and the resistance value of the terminating resistor 9 is 5Ω, and thus the combined resistance value is approximately 5Ω.

As described above, in the low frequency region, the resistance component of the matching circuit 12 is smaller than the value of the characteristic impedance of the transmission line 8. Thus, the power consumed by the matching circuit 12 is reduced, whereby the power consumption of the current sensor 110 can be suppressed. An increase in the resistance component of the matching circuit 12 is suppressed, and thus a reduction in the amount of electric current flowing through the terminating resistor 9 can be suppressed, whereby the reduction in the level of the detection signal indicating the detection voltage V2 can be suppressed. Furthermore, the resistance value of the terminating resistor 9 is set to be a value smaller than the characteristic impedance of the transmission line 8. Thus, the power consumed at the terminating resistor 9 can be reduced.

On the other hand, when the electric current to be measured I1 flowing through the measurement cable way 1 is in a high frequency range between the upper limit frequency of the low frequency region and the cutoff frequency of the matching circuit 12, the coil 3 solely operates as a CT, instead of the magnetoelectric conversion output unit 6 and the voltage current converter 7.

Specifically, the coil 3 detects the electric current to be measured I1 flowing through the measurement cable way 1, and outputs the electric current I3 with the amplitude (electric current value) changing in accordance with the amplitude (electric current value) of this electric current to be measured I1, as the detection electric current. Then, a part of the electric current I3 output from the second end 3b of the coil 3 flows through the starting resistor 11, and the remaining detection electric current flows through the terminating resistor 9 via the transmission line 8 and the matching circuit 12. Then, the detection electric current is converted into the detection voltage V2 at the terminating resistor 9.

At this timing, the resistance component is dominant in the matching circuit 12 according to the present embodiment due to the impedance of the inductance element 122 being higher than the resistance value 45Ω of the resistance element 121. Thus, the terminating resistor side impedance is a resistance value of approximately 50Ω as a result of adding the resistance component of the matching circuit 12, which is approximately 45Ω, to the combined resistance value of the starting resistor 11 and the terminating resistor 9, which is approximately 5Ω.

As described above, in the high frequency range, the terminating resistor side impedance approaches the characteristic impedance 50Ω of the transmission line 8, whereby the impedance matching can be achieved to suppress the reflection occurring at the terminating end of the transmission circuit 20.

Next, the frequency characteristics of the current sensor 110 will be described with reference to the drawings.

Figure 2:
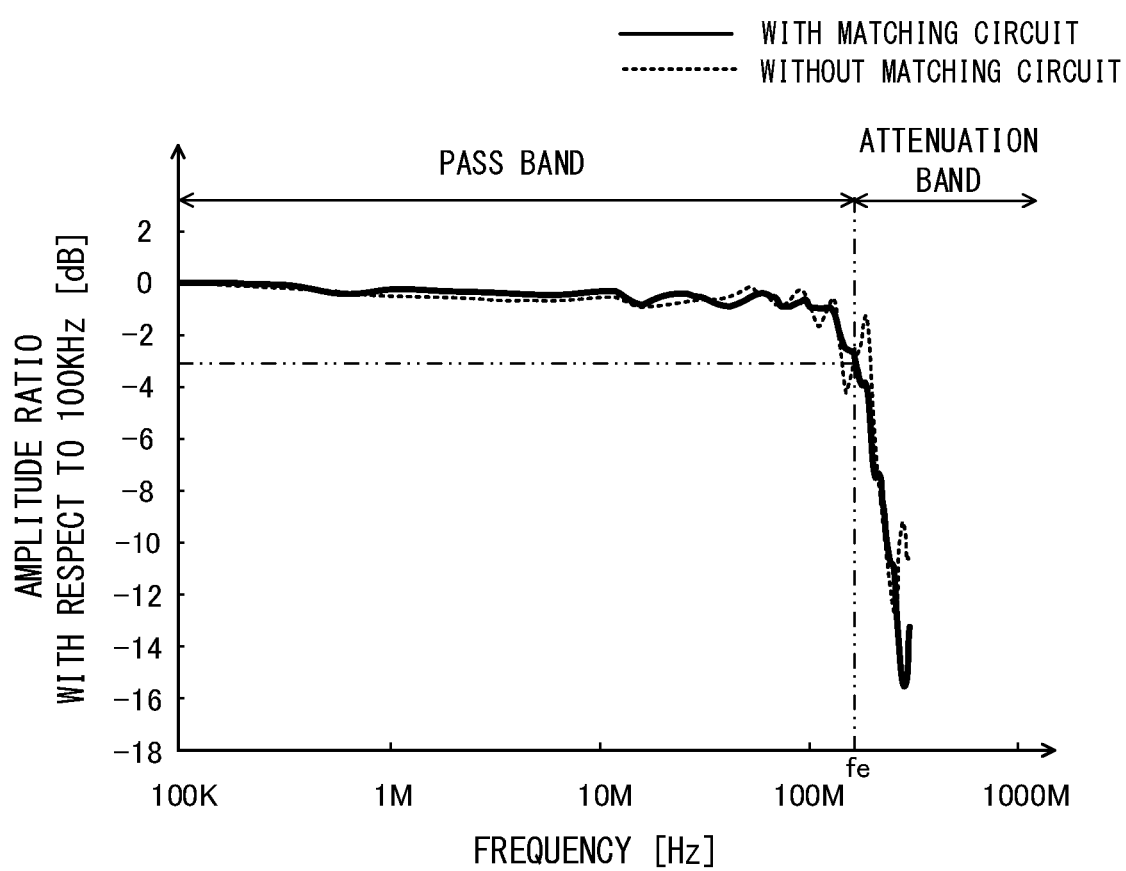
FIG. 2 is a diagram showing a result of measuring amplitude characteristics of a current sensor according to the present embodiment.

FIG. 2 is a diagram showing an example of the amplitude characteristics (output frequency characteristics) of the current sensor 110 according to the present embodiment. This example shows a result of measuring the amplitude characteristics in the frequency range of the detection signal output from the current sensor 110 having the output rate set to be 0.1 (V/A) with the upper limit frequency of the desired frequency band (the lower limit frequency of the attenuation band) fe set to be 120 MHz.

In the figure, the horizontal axis represents the frequency indicated by a logarithmic scale, and the vertical axis represents an amplitude ratio with respect to 100 kHz in a unit of decibel (dB). This amplitude ratio is a ratio of the amplitude of each frequency component to the amplitude of the frequency component of 100 kHz.

FIG. 2 also shows, as Comparative Example, the measurement result for a current sensor not including the matching circuit 12 according to the present embodiment indicated by a dotted line. As shown in FIG. 2, in Comparative Example, no impedance matching is performed in an attenuation band at and higher than a lower limit frequency fe that is 120 MHz, and thus the amplitude characteristics are disturbed due to the influence of the reflection from the measurement unit 120.

On the other hand, the current sensor 110 according to the present embodiment uses the matching circuit 12 to implement impedance matching in the attenuation band. Thus, it can be seen that the disturbance of the amplitude characteristics is suppressed, whereby the amplitude of the frequency component smoothly attenuates.

Thus, even when the measurement device 100 is used for measuring the electric current to be measured I1 at a relatively high frequency and displaying a response waveform, the measurement waveform can be displayed on the screen with small distortion due to the suppression of the influence of the reflection.

Next, the frequency characteristics of the terminating resistor side impedance of the current sensor 110 will be described with reference to FIG. 3 and FIG. 4.

Figure 3:
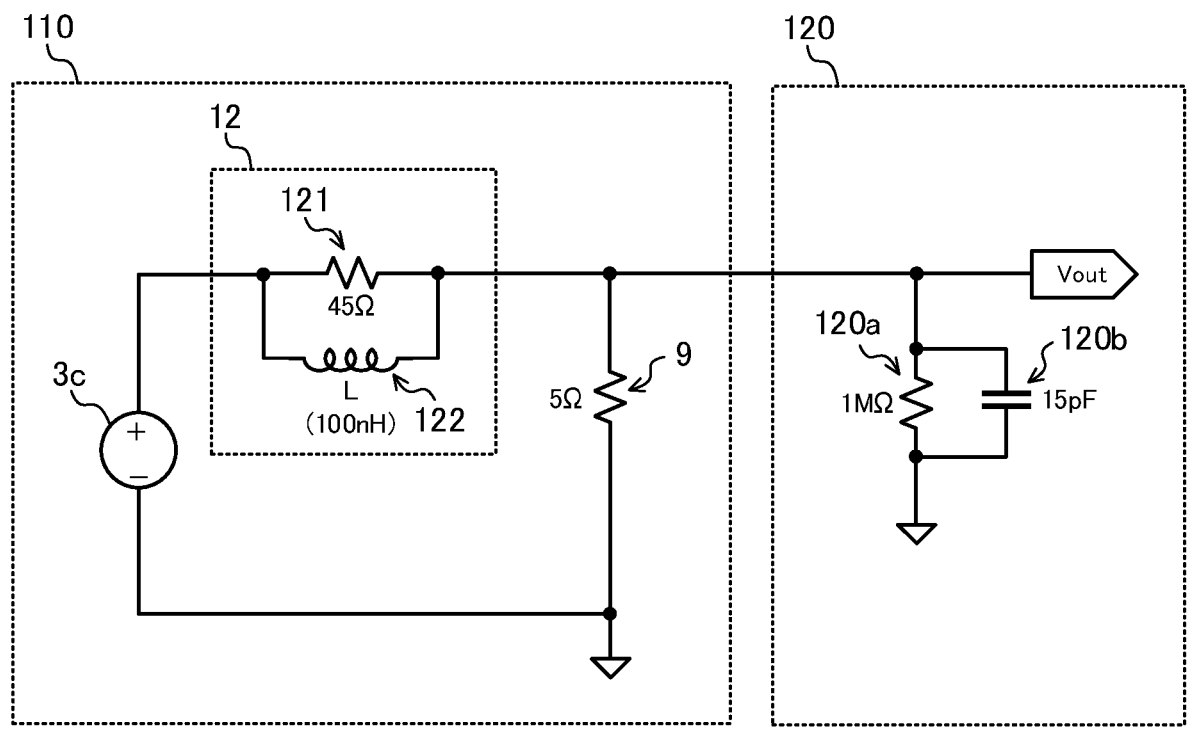
FIG. 3 is a circuit diagram showing an equivalent circuit of the measurement device according to the present embodiment.

FIG. 3 is a diagram showing an equivalent circuit of the measurement device 100 used for simulating the frequency characteristics of the terminating resistor side impedance.

In the equivalent circuit of the current sensor 110, a voltage source 3c as the coil 3 supplies the AC to the matching circuit 12. The resistance element 121 and the inductance element 122 of the matching circuit 12 respectively have a resistance value of 45Ω and an inductance value of 100 nanohenries (nH). The resistance value of the terminating resistor 9 is 5Ω. The input resistor 120a and the capacitor 120b of the measurement unit 120 respectively have a resistance value of 1 MΩ and a capacitance of 15 pF.

Figure 4:
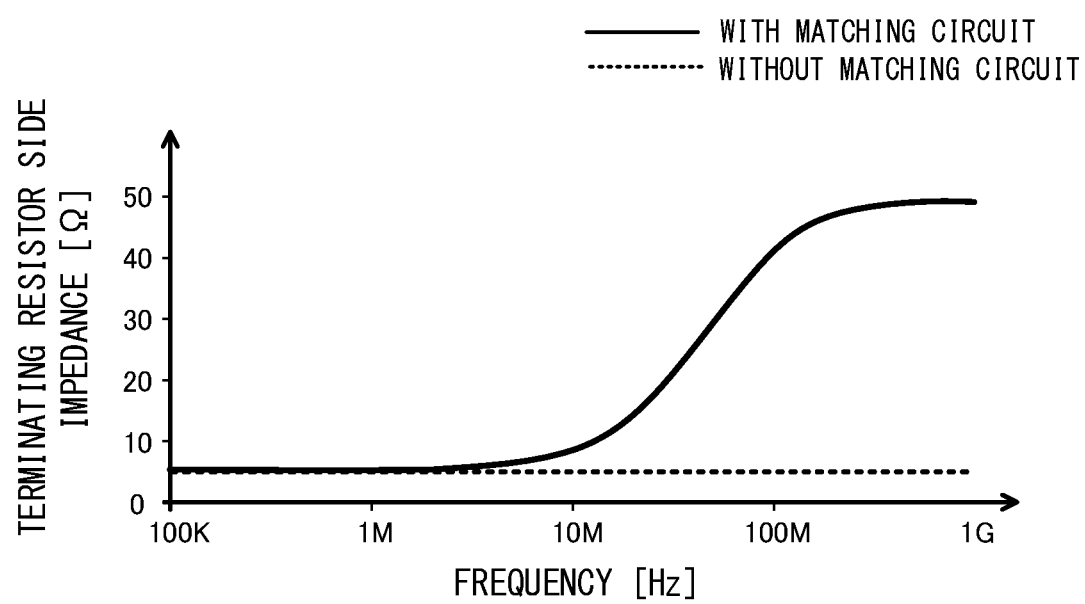
FIG. 4 is a diagram showing a result of simulating frequency characteristics of a terminating resistor side impedance using the equivalent circuit shown in FIG. 3.

FIG. 4 is a diagram showing a result of simulation in which the frequency characteristics of the terminating resistor side impedance are calculated using the equivalent circuit of the measurement device 100 shown in FIG. 3. In the figure, the horizontal axis represents a frequency indicated by a logarithmic scale [Hz], and the vertical axis represents a terminating resistor side impedance [Ω].

FIG. 4 also shows, as Comparative Example, a simulation result for a current sensor not including the matching circuit 12 according to the present embodiment indicated by a dotted line. As shown in FIG. 4, in the current sensor not including the matching circuit 12, the terminating resistor side impedance is a fixed resistance value of 5Ω. As a result, the reflection occurs at the terminating end of the transmission circuit due to impedance mismatching in the attenuation band.

If the transmission line 8 is sufficiently short, even when impedance mismatch occurs, an impact of the reflection is almost negligible. Generally, the reflection from about the lower limit frequency (100 MHz) of the attenuation band starts to occur at approximately 1 m from the start of the transmission line 8. The reflection affects the observation of the waveform response, making the accurate observation of the waveform of the electric current to be measured I1 difficult. Thus, the impedance matching is preferably implemented when the length of the transmission line 8 is 1 m or more and the pass band is about 100 MHz.

Next, the frequency characteristics of the terminating resistor side impedance in the current sensor 110 according to the present embodiment will be described.

As indicated by a solid line in FIG. 4, the impedance of the inductance element 122 in the matching circuit 12 is sufficiently smaller than the resistance value of the resistance element 121 as long as the frequency of the AC is lower than 1 MHz. Thus, the AC mainly flows through the inductance element 122, and almost no AC flows through the resistance element 121. This results in the terminating resistor side impedance having a value that is substantially the same as the resistance value 5Ω of the terminating resistor 9. The resistance component of the matching circuit 12 is much smaller than the characteristic impedance of the transmission line 8. Thus, the power consumed by the matching circuit 12 becomes small.

When the frequency of the AC is higher than 1 MHz, the impedance of the inductance element 122 becomes higher as the frequency rises, facilitating the flow of the AC to the resistance element 121. Thus, the terminating resistor side impedance overwhelms the resistance value 5Ω of the terminating resistor 9, and the power consumption by the matching circuit 12 starts to gradually increase.

When the frequency of the AC rises to be close 100 MHz, the AC mainly flows through the resistance element 121 of the matching circuit 12. Thus, the terminating resistor side impedance appears to be a sum of the resistance value 5Ω of the terminating resistor 9 and a large portion of the resistance components of the resistance element 121 which is 45Ω. Thus, the terminating resistor side impedance is about 40Ω.

It can be seen that the terminating resistor side impedance approaches the value 50Ω, which is the same as the characteristic impedance of the transmission line 8, when the frequency of the AC exceeds the lower limit frequency of the attenuation band (the upper limit frequency of the pass band) of the coil 3, which is 120 MHz.

Thus, in the pass band excluding a range near the cutoff frequency (the lower limit frequency of the attenuation band) of the current sensor 110, impact of the reflection is small, and thus the matching circuit 12 refrains from performing the impedance matching in the current sensor 110. This can prevent an increase in the power consumed by the matching circuit 12. In the attenuation band of the current sensor 110, the impact of the reflection is larger than in the case of the pass band, and thus the matching circuit 12 adjusts the terminating resistor side impedance toward the characteristic impedance of the transmission line 8. Thus, the reflection occurring at the terminating end of the current sensor 110 can be suppressed.

The example where the inductance value of the inductance element 122 included in the matching circuit 12 is set to be 100 nH has been described with reference to FIGS. 3 and 4. However, this should not be construed in a limiting sense. Now, a description will be given on a method of setting the inductance value of the inductance element 122.

The impedance Z of the equivalent circuit shown in FIG. 3 is expressed as in the following Formula (1), in which L represents the inductance value of the inductance element 122, R1 represents the resistance value of the resistance element 121, and R2 represents the resistance value of the terminating resistor 9.

[Formula 1]

$$Z = \frac{j\omega L R_1}{j\omega L + R_1} + R_2 \quad (1)$$

Formula (1) may be solved for the inductance value L of the inductance element 122, to be expressed as in the following Formula (2).

[Formula 2]

$$L = \frac{R_1(Z - R_2)}{\omega} \sqrt{\frac{1}{R_1^2 - (Z - R_2)^2}} \quad (2)$$

In the present embodiment, the impedance Z is set to be the same value as the characteristic impedance of the transmission line 8, and an angular frequency ω is set to be a value obtained by dividing the lower limit frequency fe of the attenuation band by 2π. With the matching circuit 12 configured on the basis of the relationship in Formula (2), the terminating resistor side impedance (Z) can approach the value that is the same as the characteristic impedance of the transmission line 8 in the attenuation band of the current sensor 110.

With the inductance value L of the inductance element 122 thus changed, the frequency characteristics of the terminating resistor side impedance changes. In view of this, the relationship between the inductance value L of the inductance element 122 and the frequency characteristics of the terminating resistor side impedance will be described with reference to FIG. 5.

Figure 5:
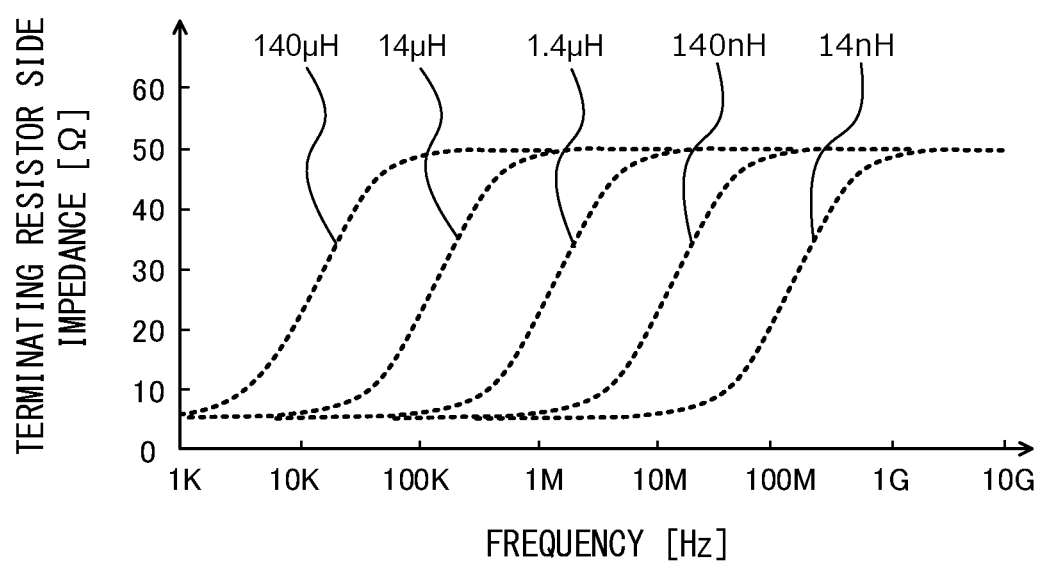
FIG. 5 is a diagram showing a result of simulating frequency characteristics of the terminating resistor side impedance with a change in an inductance value of the equivalent circuit shown in FIG. 3.

FIG. 5 is a diagram showing a change in the frequency characteristics of the terminating resistor side impedance in accordance with the inductance value L of the inductance element 122.

Here, the inductance value L of the inductance element 122 was calculated using Formula (2) described above so that 100 kHz, 1 MHz, 10 MHz, 100 MHz, and 1 GHz are obtained as the frequency f (=ω/2π) reaching the characteristic impedance of the transmission line 8. In this calculation, the impedance Z is preferably set to be 50Ω that is the same as the characteristic impedance of the transmission line 8. Still, such a value results in dispersion with the denominator in Formula (2) being 0. Thus, the impedance Z was set to be 49Ω.

With the condition described above, 140 μH, 14 μH, 1.4 μH, 140 nH, and 14 nH were obtained as the inductance value L of the inductance element 122. Thus, FIG. 5 shows frequency characteristics of the terminating resistor side impedance in a case where the inductance value L of the inductance element 122 is set to be 140 μH, 14 μH, 1.4 μH, 140 nH, and 14 nH.

It can be seen in FIG. 5, with the inductance value L of the inductance element 122 reduced stepwise from 140 μH to 14 nH, a frequency as the starting point of the change in the terminating resistor side impedance from 5Ω becomes high. Thus, by changing the inductance value L of the inductance element 122, the starting point of the impedance matching can be shifted toward the low frequency side or the high frequency side, in the frequency characteristics of the terminating resistor side impedance.

Thus, when the current sensor 110 is designed so that the terminating resistor side impedance reaches 49Ω with the frequency of 100 MHz, the terminating resistor 9, the resistance element 121, and the inductance element 122 are respectively set to 5Ω, 45Ω, and 140 nH. The amplitude characteristics of the current sensor 110 designed under this condition will be described with reference to FIGS. 6 and 7.

Figure 6:
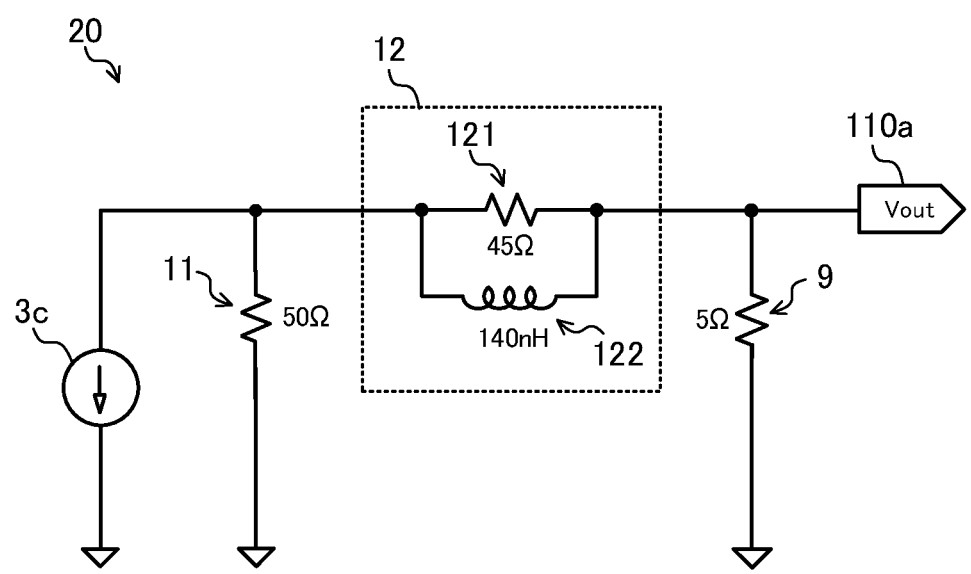
FIG. 6 is a circuit diagram showing an equivalent circuit of the current sensor according to the present embodiment.

FIG. 6 is a diagram showing an equivalent circuit of the transmission circuit 20 forming the current sensor 110 used for simulating the amplitude characteristics of the current sensor 110. Here, the resistance value of the starting resistor 11 is 50Ω, the resistance value of the resistance element 121 and the inductance value of the inductance element 122 in the matching circuit 12 are respectively 45Ω and 140 nH, and the resistance value of the terminating resistor 9 is 5Ω.

Figure 7:
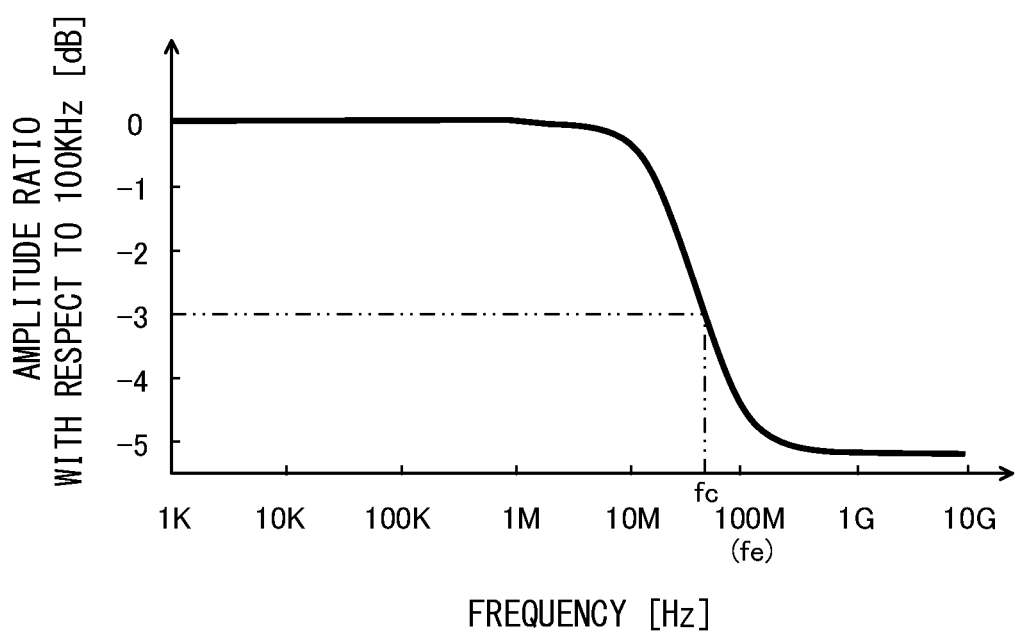
FIG. 7 is a diagram showing results of simulating the amplitude characteristics using the equivalent circuit shown in FIG. 6.

FIG. 7 is a diagram showing results of simulation in which the amplitude characteristics of the transmission circuit 20 in the current sensor 110 are calculated by using the equivalent circuit shown in FIG. 6. In this figure, the horizontal axis and the vertical axis represent the parameters that are the same as those in FIG. 2.

It can be seen in FIG. 7 that the amplitude of the frequency component attenuates by approximately 4 dB at 100 MHz, and the matching circuit 12 operates as a lowpass filter circuit. The cutoff frequency fc of the matching circuit 12 is lower than the lower limit frequency fe of the attenuation band, whereby high frequency noise included in the detection electric current from the coil 3 can be reliably removed.

When the amplitude characteristics of high frequency components of the detection electric current supplied from the coil 3 are raised, the output frequency characteristics of the current sensor 110 can be smoothed. On the other hand, when the amplitude characteristics of high frequency components are not raised, the impedance value of the inductance element 122 may be set to be small to adjust the attenuation amount at the frequency of 100 MHz to be a typical value of 3 dB.

Next, a modification of the current sensor 110 will be described with reference to FIGS. 8A and 8B.

Figure 8A:
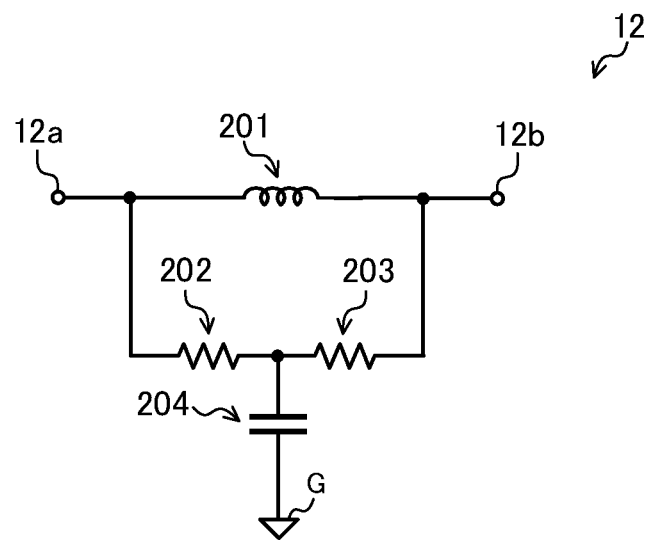
FIG. 8A is a circuit diagram showing a modification of the matching circuit provided to the current sensor.

FIG. 8A is a diagram showing a modification of the matching circuit 12 according to the present embodiment. In this modification, the matching circuit 12 is a single-stage impedance filter including an inductance element 201, a resistance element 202, a resistance element 203, and a capacitor 204. The inductance element 201 has both ends each connected to a corresponding one of the input terminal 12a and the output terminal 12b of the matching circuit 12, and are connected in parallel with the resistance element 202 and the resistance element 203 connected in series with each other. A connection point between the resistance element 202 and the resistance element 203 is connected to a first end of the capacitor 204. A second end of the capacitor 204 is connected to the ground G.

Figure 8B:
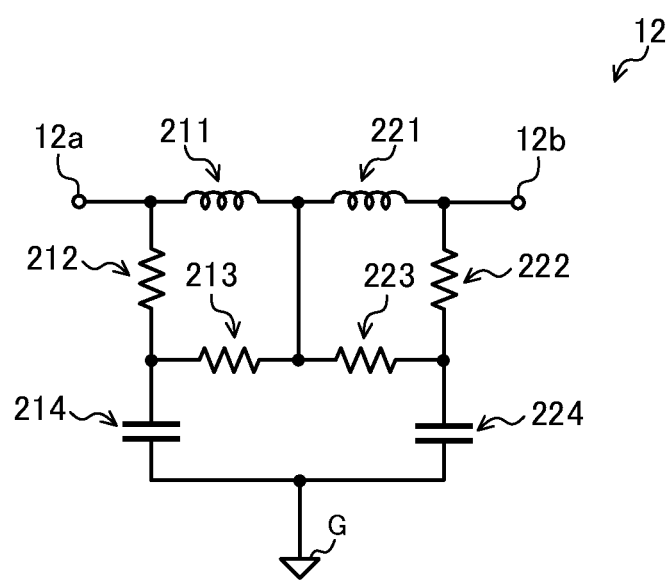
FIG. 8B is a circuit diagram showing another modification of the matching circuit.

FIG. 8B is as diagram showing another modification of the matching circuit 12. In this example, the matching circuit 12 includes an inductance element 211, a resistance element 212, and a resistance element 213 as well as a capacitor 214, an inductance element 221, a resistance element 222, a resistance element 223, and a capacitor 224. Thus, the matching circuit 12 is a two-stage impedance filter having two single-stage impedance filters as shown in FIG. 8A connected in series with each other.

In the matching circuits 12 shown in FIGS. 8A and 8B, the constants of the passive elements are set so that the terminating resistor side impedance is adjusted toward the characteristic impedance of the transmission line 8, in the attenuation band of the current sensor 110. Thus, the reflection in the attenuation band of the current sensor 110 is suppressed, whereby the distortion of the waveform of the detection signal can be suppressed.

The matching circuit 12 may be configured by a multi-stage fixed impedance filter having sharper cutoff characteristics, with three or more single-stage impedance filters as shown in FIG. 8A connected in series with each other.

Next, operations and effects of the current sensor 110 according to the first embodiment will be described in detail.

According to the present embodiment, the current sensor 110 configured to detect electric current flowing through the measurement cable way 1 serving as an object to be measured includes the magnetic core 2 through which the measurement cable way 1 is inserted, the coil 3 wound around the magnetic core 2, and the transmission line 8 configured to transmit electric current supplied from the coil 3. The current sensor 110 further includes the terminating resistor 9 configured to convert electric current from the terminating end 8b of the transmission line 8 into voltage and outputs the voltage, and the impedance matching unit 10 constituting a matching unit configured to implement impedance matching between the coil 3 and the terminating resistor 9.

The impedance matching unit 10 is configured to raise, to the value of the characteristic impedance of the transmission line 8, at least one of the terminating resistor side impedance viewed from the terminating end 8b of the transmission line 8 toward the terminating resistor 9 and the coil side impedance viewed from the starting end 8a of the transmission line 8 toward the coil 3, in the attenuation band of the current sensor 110.

In particular, according to the present embodiment, as illustrated in FIG. 1 and FIG. 4, the impedance matching unit 10 raises the terminating resistor side impedance to the value of the characteristic impedance of the transmission line 8, in the attenuation band of the current sensor 110. This attenuation band is a frequency band including components involving amplitude attenuation, among the frequency components of the voltage output from the terminating resistor 9.

With the impedance matching unit 10 thus provided, the terminating resistor side impedance raises from the resistance value of the terminating resistor 9 to the value of the characteristic impedance of the transmission line 8 in the attenuation band involving a large impact of the reflection. Thus, the reflection is less likely to occur around the attenuation band, whereby the waveform distortion of a signal output from the current sensor 110 can be suppressed.

On the other hand, with the impedance matching unit 10 provided, the terminating resistor side impedance is prevented from rising to the characteristic impedance of the transmission line 8 in a pass band that includes no components around the lower limit frequency of the attenuation band and involves a small impact of the reflection. Thus, the terminating resistor side impedance stays substantially the same. This means that the power consumed by the impedance matching unit 10 almost does not increase at all, whereby an increase in the power consumed by the impedance matching unit 10 can be suppressed.

Thus, an increase in the power consumed by the current sensor 110 can be suppressed, and also the waveform distortion of the signal output from the current sensor 110 can be suppressed.

Furthermore, according to the present embodiment, the impedance matching unit 10 includes the matching circuit 12 configured to make the terminating resistor side impedance in the attenuation band approach the characteristic impedance of the transmission line 8.

With the matching circuit 12 thus used to make the terminating resistor side impedance approach the characteristic impedance of the transmission line 8 in the attenuation band of the current sensor 110, the reflection in the attenuation band can be suppressed. Thus, as indicated by the dotted line in FIG. 2, disturbance of the amplitude characteristics can be suppressed in the attenuation band, whereby the waveform distortion of the detection signal output from the current sensor 110 can be suppressed.

Furthermore, according to the present embodiment, the resistance value of the terminating resistor 9 is set to be a predetermined value smaller than the characteristic impedance of the transmission line 8. Thus, the power consumed by the terminating resistor 9 is reduced, whereby heat generation by the terminating resistor 9 can be suppressed.

With the resistance value of the terminating resistor 9 set to be smaller than the value of the characteristic impedance of the transmission line 8, even when the large electric current flows in the measurement cable way 1 to result in large detection electric current supplied to the terminating resistor 9 from the coil 3, the heat generation of the terminating resistor 9 is suppressed because the resistance value of the terminating resistor 9 is small. Thus, with the current sensor 110 used, no heat generation prevention means needs to be provided for the terminating resistor 9 even when the electric current to be measured I1 with a large electric current value flows in the measurement cable way 1.

Furthermore, according to the present embodiment, the resistance value of the resistance element 121 serving as the resistance component of the matching circuit 12 is set to be a larger value with the resistance value of the terminating resistor 9 (predetermined value) set to a smaller value. With the resistance value of the resistance element 121 of the matching circuit 12 set to be relatively large, the resistance value of the terminating resistor 9 can be reduced so that the amount of heat generation from the terminating resistor 9 can further be reduced.

Furthermore, according to the present embodiment, as shown in FIG. 7, the matching circuit 12 may have the cutoff frequency fc set to be a value lower than the lower limit frequency fe of the attenuation band of the current sensor 110. Thus, smooth amplitude characteristics of the current sensor 110 can be achieved in a case where the amplitude characteristics of a high frequency component raises over the amplitude characteristics of a low frequency component in the detection electric current supplied from the coil 3.

Furthermore, according to the present embodiment, the matching circuit 12 includes a plurality of passive elements to make the terminating resistor side impedance approach the characteristic impedance of the transmission line 8, in a high frequency band at and higher than the cutoff frequency fc.

With the matching circuit 12 thus including a plurality of passive elements, the noise produced from the matching circuit 12 itself can be reduced compared with a case where the matching circuit 12 includes active elements, while implementing the impedance matching in a frequency band at and above the cutoff frequency. Thus, the waveform distortion of the detection signal output from the current sensor 110 can be suppressed while reducing the noise mixed in the detection electric current supplied from the coil 3.

Furthermore, according to the present embodiment, the matching circuit 12 includes, as shown in FIG. 1, the resistance element 121 and the inductance element 122 connected in parallel with each other. Thus, the number of parts of the matching circuit 12 can be reduced, whereby the matching circuit 12 can have a simple configuration.

Furthermore, according to the present embodiment, as in Formula (2) above, the inductance value L of the inductance element 122 is set on the basis of the lower limit frequency fe of the attenuation band, the characteristic impedance Z of the transmission line 8, the resistance value R1 of the resistance element 121, and the resistance value R2 of the terminating resistor.

Thus, the matching circuit 12 can be configured in such a manner that the terminating resistor side impedance approaches the value of the characteristic impedance of the transmission line 8 as a frequency component in the detection electric current supplied from the coil 3 approaches the lower limit frequency fe of the attenuation band of the current sensor 110.

Furthermore, according to the present embodiment, the impedance matching unit 10 includes the starting resistor 11 connected to the starting end 8a of the transmission line 8 and connected in parallel with the coil 3. The matching circuit 12 is connected in series with the terminating end 8b of the transmission line 8, and the resistance value of the starting resistor 11 is set to be a value larger than the resistance value of the terminating resistor 9.

With the matching circuit 12 thus provided on the terminating end 8b side of the transmission line 8, the coil 3 and the matching circuit 12 can be separated from each other by a distance larger than that in a case where the matching circuit 12 is arranged at the starting end 8a of the transmission line 8. As a result, the frequency characteristics of the matching circuit 12 are less likely to involve an undesired peak appearing near the cutoff frequency due to the oscillation between the parasitic capacitance of the coil 3 and the inductance element 122 of the matching circuit 12.

Furthermore, with the starting resistor 11 provided at the starting end 8a of the transmission line 8, the detection electric current flowing in the terminating resistor 9 is reduced, so that the power consumed by the terminating resistor 9 can be reduced. Thus, heat generation by the terminating resistor 9 can be suppressed. As a result, the need for heat generation prevention means for the terminating resistor 9 is reduced, whereby a manufacturing cost of the current sensor 110 can be reduced.

Furthermore, the resistance value of the starting resistor 11 set to be larger than the resistance value of the terminating resistor 9 results in the detection electric current more likely to flow to the terminating resistor 9 than to the starting resistor 11 in the pass band, so that a higher signal level of the detection voltage V2 can be achieved. Thus, the S/N ratio of the detection signal can be improved.

Furthermore, according to the present embodiment, the length of the transmission line 8 is set to be longer than a predetermined length with which the reflection occurs on the basis of the lower limit frequency of the attenuation band of the current sensor 110. Thus, with the matching circuit 12, the reflection can be reliably suppressed in the attenuation band of the current sensor 110.

Furthermore, according to the present embodiment, the matching circuit 12 is configured as a lowpass filter circuit. Thus, the noise component in the attenuation band of the current sensor 110 can be removed while suppressing the waveform distortion of the detection signal as described above.

Furthermore, according to the present embodiment, the measurement device 100 includes the current sensor 110 described above and the measurement unit 120 configured to measure a physical quantity related to the measurement cable way 1 on the basis of a detection signal output from the current sensor 110. Thus, the waveform response of the electric current to be measured I1 flowing in the measurement cable way 1 can be accurately measured, and the power consumption by the current sensor 110 can be suppressed.

Second Embodiment

In the example described in the first embodiment, the matching circuit 12 is connected in series with the terminating end 8b of the transmission line 8. In addition to or instead of this configuration, the matching circuit 12 may be connected to the starting end 8a side of the transmission line 8. Thus, the configuration with the matching circuit 12 connected to the starting end 8a side of the transmission line 8 will be briefly described as a second embodiment with reference to FIG. 9.

Figure 9:
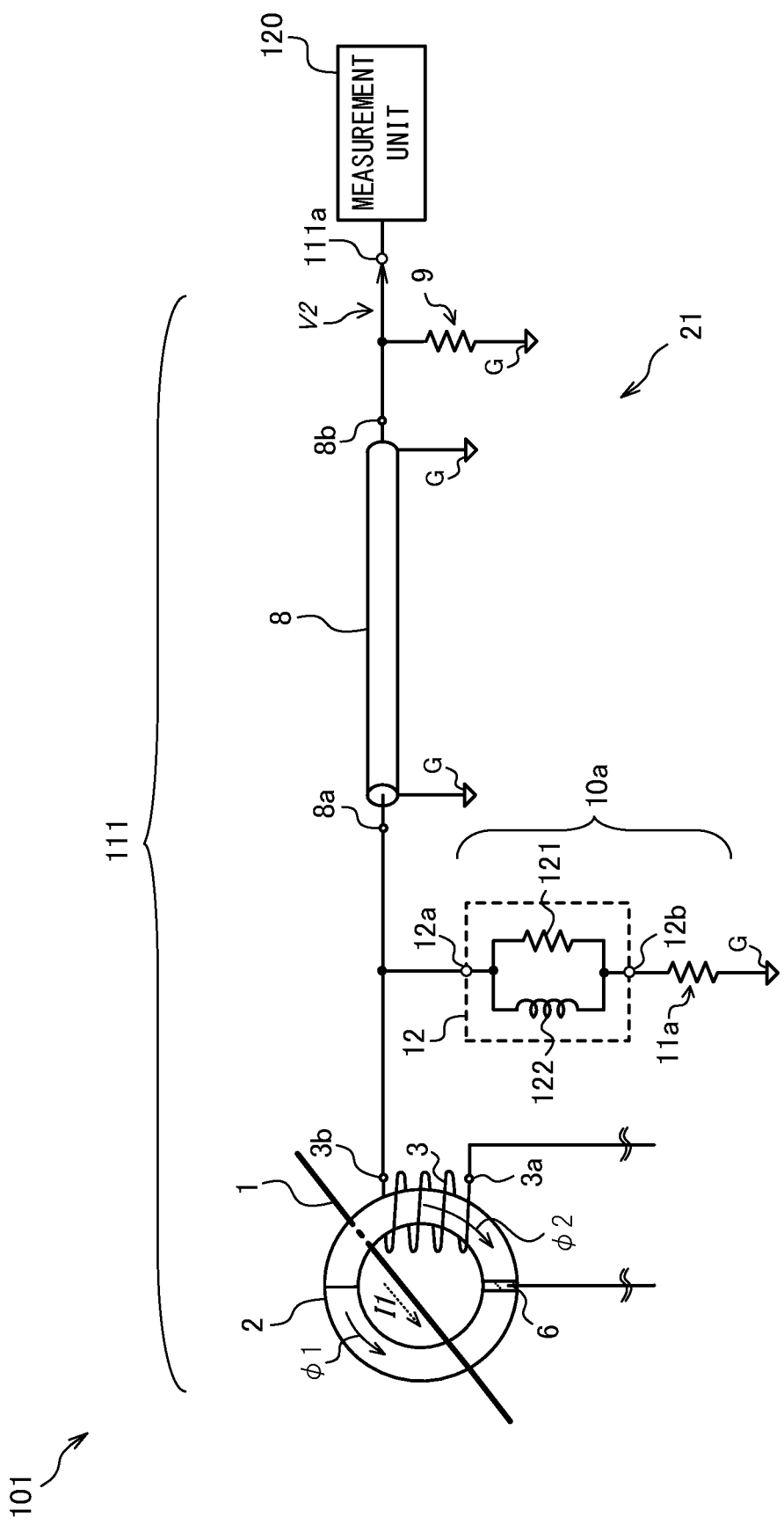
FIG. 9 is a diagram showing a configuration of a measurement device including a current sensor according to a second embodiment.

FIG. 9 is a diagram showing a configuration of a measurement device 101 including a current sensor 111 according to the second embodiment. In the figure, the transmission line 4, the capacitive load 5, the magnetoelectric conversion output unit 6, and the voltage current converter 7 are omitted for the sake of illustration.

The matching circuit 12 according to the present embodiment is the same as the configuration shown in FIG. 1, but is connected to a position different from that shown in FIG. 1. The matching circuit 12 is connected to the starting end 8a of the transmission line 8. The transmission circuit 21 forming the current sensor 111 according to the present embodiment includes a starting resistor 11a instead of the starting resistor 11 shown in FIG. 1.

In the transmission circuit 21, the starting resistor 11a is arranged at the starting end 8a of the transmission line 8, and is connected in series with the matching circuit 12. Specifically, the starting resistor 11a is connected to the starting end 8a of the transmission line 8, and is connected in parallel with the coil 3. Specifically, the starting resistor 11a has a first end connected to the output terminal 12b of the matching circuit 12 and has a second end connected to the ground G.

In the present embodiment, the resistance value of the starting resistor 11a is set to be 5Ω, and the resistance value of the terminating resistor 9 is set to be 50Ω. Thus, the resistance value of the starting resistor 11a is set to be a value larger than the resistance value of the terminating resistor 9.

Thus, in the attenuation band of the current sensor 111, the resistance value 5Ω of the starting resistor 11a and the resistance value 45Ω of the resistance element 121 forming the matching circuit 12 are combined, whereby a coil side impedance of 50Ω is obtained. Thus, with the matching circuit 12 provided, the coil side inductance rises to the value of the characteristic impedance of the transmission line 8.

Thus, the terminating resistor side impedance and the coil side inductance can match in the attenuation band of the current sensor 111. As a result, the reflection is less likely to occur at the starting end 8a of the transmission line 8, whereby the waveform distortion of the detection signal attributable to the current sensor 111 can be suppressed.

In the second embodiment, the impedance matching unit 10a raises the coil side impedance to a value of the characteristic impedance of the transmission line 8 in the attenuation band of the current sensor 111. As a result, as in the first embodiment, an increase in the power consumed by the current sensor 111 in the pass band of the current sensor 111 can be suppressed, and the waveform distortion of a signal output from the current sensor 111 can be suppressed.

The measurement device 101 according to the second embodiment may include the terminating resistor 9 with the resistance value of 5Ω and the matching circuit 12 according to the first embodiment, in addition to the impedance matching unit 10a. Thus, in the attenuation band of the current sensor 111, both of the coil side impedance and the terminating resistor side impedance can be raised to the value of the characteristic impedance of the transmission line 8.

Thus, according to the embodiments described above, the impedance matching unit 10, 10a can raise at least one of the terminating resistor side impedance and the coil side impedance to the value of the characteristic impedance of the transmission line 8 in the attenuation band of the current sensor 110.

The embodiments of the present invention described above are merely an example of an application of the present invention. Thus, the technical scope of the present invention is not intended to be limited to the specific configuration of the embodiments described above.

For example, the zero-flux (magnetic balance) current sensor 110 according to the present embodiment includes the transmission line 4, the capacitive load 5, the magnetoelectric conversion output unit 6, and the voltage current converter 7, but the transmission line 4 can be omitted.

In the present embodiment, the matching circuit 12 implementing the impedance matching also operated as a lowpass filter. Alternatively, the impedance matching function and the lowpass filter function can be implemented by different circuits.

In the present embodiment, the lower limit frequency fe of the attenuation band is a value of a frequency as a result of attenuating an amplitude in the pass band by 3 dB. However, this should not be construed in a limiting sense, and the lower limit frequency fe may be a value of a frequency at which the amplitude in the pass band starts to attenuate, or a value as a result of attenuating the amplitude by 1 dB.

In the present embodiment, the resistance value of the terminating resistor 9 is set to be a value smaller than the characteristic impedance of the transmission line 8. Alternatively, the resistance value of the terminating resistor 9 is set to be a value larger than the characteristic impedance of the transmission line 8. In such a case, the inductance element (coil) or a serial circuit with the inductance element and the resistance element in serial connection is connected in parallel with the terminating resistor 9. Furthermore, the constant of the inductance element or the serial circuit is set so that the resistance element side impedance is adjusted toward the characteristic impedance of the transmission line 8 in the attenuation band. Alternatively, a resistance element with the same value as the characteristic impedance of the transmission line 8 is provided in parallel with the terminating resistor 9, and a switch that switches the electric current path from the terminating resistor 9 to the resistance element when the frequency of the detection electric current becomes close to the attenuation band is provided at a connection portion between the terminating resistor 9 and the resistance element.

Thus, in the attenuation band of the current sensor, the terminating resistor side impedance can be lowered to the characteristic impedance of the transmission line 8 and the power consumption by the current sensor can be reduced.

The present application claims priority based on Japanese Patent Application No. 2019-045106 filed on Mar. 12, 2019, the entire contents of which are incorporated into this specification by reference.

DESCRIPTION OF REFERENCE SIGNS

2: Magnetic core
3: Coil
8: Transmission line
9: Terminating resistor
10, 10a: Impedance matching unit (matching unit)
11: Starting resistor
12: Matching circuit
100, 101: Measurement device
110, 111: Current sensor
120: Measurement unit
121: Resistance element
122: Inductance element

What is claimed is:

1. A current sensor configured to detect electric current flowing through an object to be measured, the current sensor comprising:
a magnetic core through which the object to be measured is inserted;
a coil wound around the magnetic core;
a transmission line configured to transmit electric current supplied from the coil;
a terminating resistor configured to convert electric current from a terminating end of the transmission line into voltage and output the voltage; and
a matching unit configured to implement impedance matching between the coil and the terminating resistor, wherein
the matching unit is configured to raise, to a characteristic impedance of the transmission line, at least one of an impedance viewed from the terminating end of the transmission line toward the terminating resistor and an impedance viewed from a starting end of the transmission line toward the coil, in a band of frequency components involving amplitude attenuation among frequency components of the voltage output from the terminating resistor.

2. The current sensor according to claim 1, wherein the matching unit includes a matching circuit configured to make the impedance viewed from the terminating end of the transmission line toward the terminating resistor, approach the characteristic impedance of the transmission line, in the band of frequency components involving amplitude attenuation.

3. The current sensor according to claim 2, wherein a resistance value of the terminating resistor is set to be a predetermined value smaller than the characteristic impedance of the transmission line.

4. The current sensor according to claim 3, wherein a resistance component of the matching circuit is set to be a larger value with the predetermined value set to a smaller value.

5. The current sensor according to claim 2, wherein the matching circuit has a cutoff frequency set to be a value lower than a lower limit frequency of the band of frequency components involving amplitude attenuation.

6. The current sensor according to claim 2, wherein the matching circuit includes a plurality of passive elements to make the impedance viewed from the terminating end of the transmission line toward the terminating resistor, approach the characteristic impedance of the transmission line, in a frequency band at and higher than a cutoff frequency.

7. The current sensor according to claim 2, wherein the matching circuit includes a resistance element and an inductance element connected in parallel with each other.

8. The current sensor according to claim 7, wherein an inductance value of the inductance element is set on the basis of a lower limit frequency of the band of frequency components involving amplitude attenuation, the characteristic impedance of the transmission line, a resistance value of the resistance element, and a resistance value of the terminating resistor.

9. The current sensor according to claim 2, wherein the matching unit includes, at the starting end of the transmission line, a starting resistor connected in parallel with the coil,
the matching circuit is connected in series to the terminating end of the transmission line, and
a resistance value of the starting resistor is set to be a value larger than a resistance value of the terminating resistor.

10. The current sensor according to claim 2, wherein the matching circuit includes a lowpass filter circuit.

11. A measurement device comprising:
the current sensor according to claim 1; and
a measurement unit configured to measure a physical quantity related to the object to be measured on the basis of a detection signal output from the current sensor.

12. A measurement device comprising:
the current sensor according to claim 2; and
a measurement unit configured to measure a physical quantity related to the object to be measured on the basis of a detection signal output from the current sensor.

* * * * *